United States Patent
Yokota et al.

(10) Patent No.: US 11,784,438 B2
(45) Date of Patent: Oct. 10, 2023

(54) CONNECTOR ATTACHED MULTI-CONDUCTOR CABLE

(71) Applicant: SUMITOMO ELECTRIC INDUSTRIES, LTD., Osaka (JP)

(72) Inventors: Naoshige Yokota, Tochigi (JP); Masaki Suzuki, Tochigi (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 386 days.

(21) Appl. No.: 17/293,150

(22) PCT Filed: Sep. 15, 2020

(86) PCT No.: PCT/JP2020/034980
§ 371 (c)(1),
(2) Date: May 12, 2021

(87) PCT Pub. No.: WO2021/161570
PCT Pub. Date: Aug. 19, 2021

(65) Prior Publication Data
US 2022/0311189 A1    Sep. 29, 2022

(30) Foreign Application Priority Data
Feb. 12, 2020  (JP) ................ 2020-021343

(51) Int. Cl.
*H01R 12/00* (2006.01)
*H01R 13/6473* (2011.01)
(Continued)

(52) U.S. Cl.
CPC ........ *H01R 13/6473* (2013.01); *H01R 24/28* (2013.01); *H05K 1/025* (2013.01);
(Continued)

(58) Field of Classification Search
CPC ............ H01R 13/646; H01R 13/6473; H01R 13/6474; H01R 24/28; H01R 24/30;
(Continued)

(56) References Cited

U.S. PATENT DOCUMENTS

2007/0111597 A1   5/2007   Kondou et al.
2009/0104819 A1   4/2009   Hermant et al.
(Continued)

FOREIGN PATENT DOCUMENTS

JP   2007-141522   6/2007
JP   2012-064338   3/2012
(Continued)

*Primary Examiner* — Khiem M Nguyen
(74) *Attorney, Agent, or Firm* — IPUSA, PLLC

(57) ABSTRACT

A connector attached multi-conductor cable includes a multi-conductor cable and a connector that includes a circuit board including first to third surfaces. The circuit board includes first pads provided on the first surface and connected to central conductors of wires; second pads provided on the first surface, arranged in a first direction parallel to the third surface, and connected to the first pads; a first ground layer provided between the first and second surfaces, and extending in a second direction parallel to the first surface and perpendicular to the first direction; and a conductive member provided apart from the first pads in the second direction with respect to the second pads, and connected to the first ground layer. The conductive member is positioned on the first surface side with respect to the first ground layer in a third direction perpendicular to the first surface.

16 Claims, 6 Drawing Sheets

(51) Int. Cl.
*H01R 24/28* (2011.01)
*H05K 1/02* (2006.01)

(52) U.S. Cl.
CPC .......... *H05K 2201/094* (2013.01); *H05K 2201/09381* (2013.01); *H05K 2201/09409* (2013.01); *H05K 2201/09427* (2013.01); *H05K 2201/09672* (2013.01); *H05K 2201/1034* (2013.01); *H05K 2201/10356* (2013.01)

(58) Field of Classification Search
CPC ... H05K 2201/09381; H05K 2201/094; H05K 2201/09409; H05K 2201/09427; H05K 2201/09672; H05K 2201/1034; H05K 2201/10356
USPC .................................................. 439/55, 78
See application file for complete search history.

(56) References Cited

U.S. PATENT DOCUMENTS

| | | |
|---|---|---|
| 2012/0064762 A1 | 3/2012 | Muroi et al. |
| 2023/0100232 A1* | 3/2023 | Qiao ............... H05K 3/3421 174/261 |
| 2023/0137227 A1* | 5/2023 | Guo ............... H01R 13/6471 439/78 |
| 2023/0187865 A1* | 6/2023 | Toda ............... H05K 1/144 439/55 |
| 2023/0198177 A1* | 6/2023 | Zhang ............. G06F 1/183 361/767 |
| 2023/0216254 A1* | 7/2023 | Morgan ........... H01R 24/28 439/405 |

FOREIGN PATENT DOCUMENTS

| | | |
|---|---|---|
| JP | 2017-069152 | 4/2017 |
| JP | 2017-069155 | 4/2017 |

* cited by examiner

CONNECTOR ATTACHED MULTI-CONDUCTOR CABLE

TECHNICAL FIELD

The present disclosure relates to a connector attached multi-conductor cable.

The present application claims priority under Japanese Application No. 2020-021343, filed on Feb. 12, 2020, the entire contents of which are hereby incorporated by reference.

BACKGROUND ART

As a connector attached multi-conductor cable used for transmission between electronic devices, a connector attached multi-conductor cable that can be connected to an electronic device regardless of the orientation of the top and bottom of the connector, has been disclosed (Patent Document 1).

RELATED-ART DOCUMENTS

Patent Document

Patent Document 1: Japanese Laid-Open Patent Application No. 2017-69152

SUMMARY OF INVENTION

Means for Solving Problems

A connector attached multi-conductor cable according to the present disclosure includes a multi-conductor cable including a plurality of electric wires; and a connector connected to one end of the multi-conductor cable, wherein the connector includes a circuit board including a first surface, a second surface on a side opposite to the first surface, and a third surface provided at a tip in a direction of connector insertion to connect the first surface to the second surface, wherein the circuit board includes a first group of pads including a plurality of first pads provided on the first surface and connected to central conductors of the electric wires, a second group of pads including a plurality of second pads provided on the first surface, arranged in a first direction parallel to the third surface as viewed from above a top surface of the first surface, and connected to the first pads, a first ground layer provided between the first surface and the second surface, and extending in a second direction parallel to the first surface and perpendicular to the first direction, and a conductive member provided on a side apart from the first group of pads in the second direction with respect to the second group of pads, and connected to the first ground layer, and wherein the conductive member is positioned on the first surface side with respect to the first ground layer in a third direction perpendicular to the first surface.

MODE FOR CARRYING OUT THE INVENTION

Figure 1:
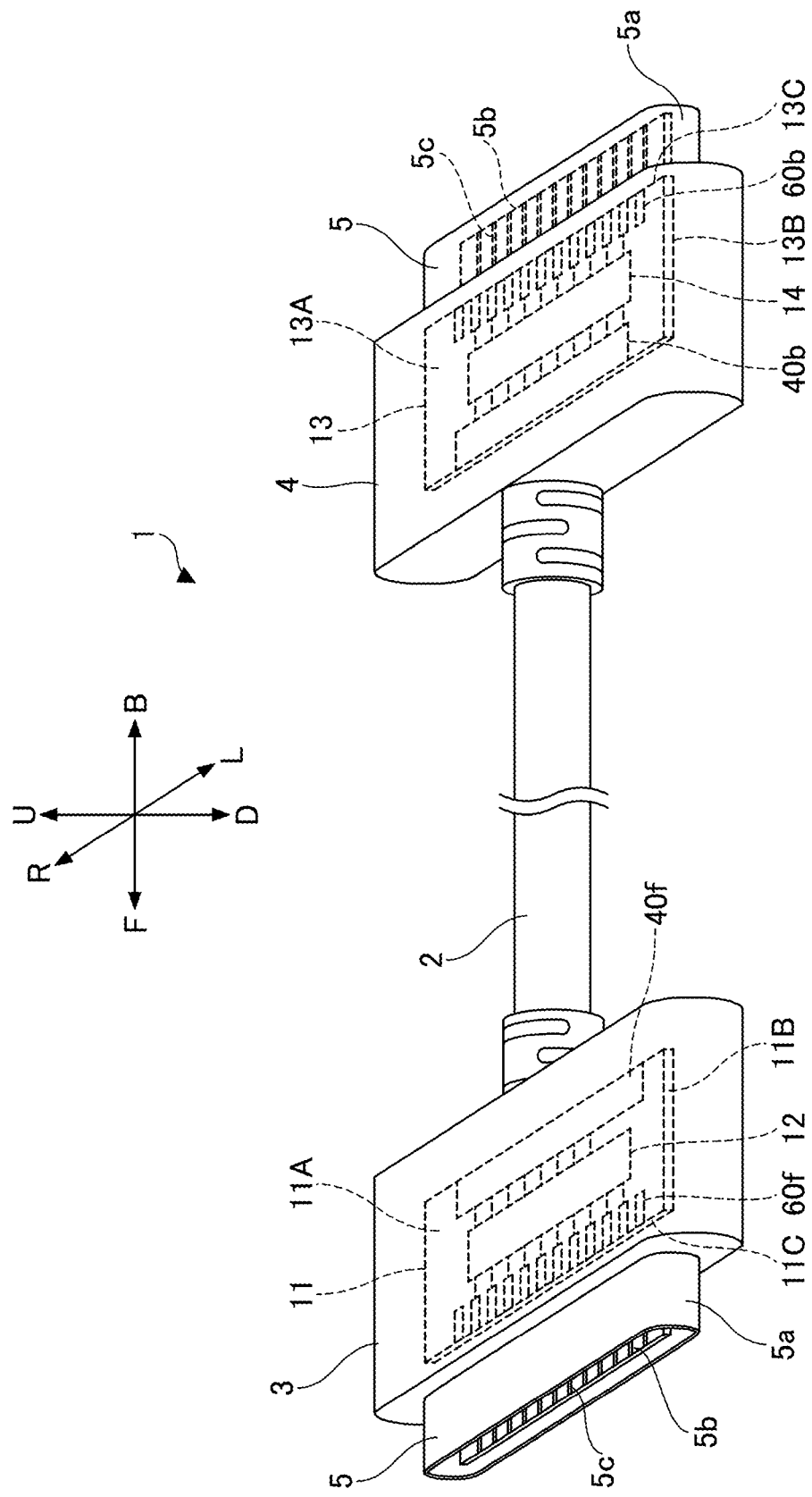
FIG. 1 is a perspective view illustrating a configuration of a connector attached multi-conductor cable according to an embodiment.

Problems to be Solved by the Present Disclosure

According to a multi-conductor cable disclosed in Patent Document 1, although the intended purpose can be achieved, if the frequency of transmitted signals increase, reflection is likely to occur.

The present disclosure has an object to provide a connector attached multi-conductor cable that is capable of reducing reflection of signals.

Effect of the Disclosure

According to the present disclosure, reflection of signals can be reduced.

Embodiments for implementation will be described in the following.

DESCRIPTION OF EMBODIMENTS OF THE PRESENT DISCLOSURES

[1] A connector attached multi-conductor cable according to one aspect in the present disclosure includes a multi-conductor cable including a plurality of electric wires; and a connector connected to one end of the multi-conductor cable, wherein the connector includes a circuit board including a first surface, a second surface on a side opposite to the first surface, and a third surface provided at a tip in a direction of connector insertion to connect the first surface to the second surface, wherein the circuit board includes a first group of pads including a plurality of first pads provided on the first surface and connected to central conductors of the electric wires, a second group of pads including a plurality of second pads provided on the first surface, arranged in a first direction parallel to the third surface as viewed from above a top surface of the first surface, and connected to the first pads, a first ground layer provided between the first surface and the second surface, and extending in a second direction parallel to the first surface and perpendicular to the first direction, and a conductive member provided on a side apart from the first group of pads in the second direction with respect to the second group of pads, and connected to the first ground layer, and wherein the conductive member is positioned on the first surface side with respect to the first ground layer in a third direction perpendicular to the first surface.

The conductive member is provided on the side apart from the first group of pads with respect to the second group of pads in the second direction, connected to the first ground layer, and positioned on the first surface-side with respect to the first ground layer in the third direction. In addition, it is connected to the second group of pads, and the connector pins through which signals are transmitted are provided above the conductive member. Therefore, even in the case where the frequency of signals transmitted via the connector pins is high, for example, even in the case where the frequency is around 20 GHz, unmatching of the differential impedance can be suppressed in the connecting part of the connector pins and the second group of pads, and signal reflection in the vicinity of this connecting part can be suppressed.

[2] In [1], the conductive member may include a second ground layer positioned on the first surface side with respect to the first ground layer in the third direction, and a conductive path connecting the first ground layer and the second ground layer. It becomes easier to position the conductive member on the first surface side with respect to the first ground layer.

[3] In [1] or [2], part of the conductive member may be exposed on the first surface. It becomes easier to suppress unmatching of the differential impedance.

[4] In [1] to [3], the conductive member may include a third pad for grounding provided on the first surface on a side apart from the first group of pads in the second direction with respect to the second group of pads. The third pad facilitates shortening the distance between the connector pins and the conductive member.

[5] In [4], the third pad may include a portion arranged in parallel with the plurality of second pads in the first direction. It becomes easier to hold the electric potential of the third pad to the ground.

[6] In [4] or [5], a thickness of the third pad may be equal to a thickness of the second plurality of pads. It becomes easier to form the third pad simultaneously with the second group of pads.

[7] In [4] to [6], a size of the third pad in the second direction may be greater than or equal to 0.5 mm and less than or equal to 2.0 mm. Reflection can be suppressed appropriately while keeping down the size of the circuit board.

[8] in [1] to [7], the first pads and the second pads may be pads for signal transmission. Reflection of signals transmitted through the first pads and the second pads can be suppressed.

[9] In [1] to [8], the multi-conductor cable may include a ground conductor, and the circuit board includes a fourth pad provided on the first surface, and connected to the first ground layer and the ground conductor. The first ground layer can be easily connected with the ground conductor.

[10] In [9], the electric wire may be a coaxial electric wire including an insulating layer formed on an outer circumference of the central conductor, and an external conductor formed on an outer circumference of the insulating layer, and the ground conductor may be the external conductor. The external conductor of the coaxial electric wire can be used as the ground conductor.

[11] In [1] to [10], the circuit board may include a plurality of wirings each connected to one of the plurality of first pads, and the one of the plurality of wirings may be connected to one of the plurality of second pads. The first pads can be easily connected with the second pads.

[12] A connector attached multi-conductor cable according to another aspect in the present disclosure includes a multi-conductor cable including a plurality of coaxial electric wires; and a connector connected to one end of the multi-conductor cable, wherein each of the plurality of coaxial electric wire includes a central conductor, an insulating layer formed on an outer periphery of the central conductor, and an external conductor formed on an outer circumference of the insulating layer, wherein the connector includes a circuit board including a first surface, a second surface on a side opposite to the first surface, and a third surface provided at a tip in a direction of connector insertion to connect the first surface to the second surface, and wherein the circuit board includes a first group of pads including a plurality of first pads provided on the first surface to which the central conductors are connected, a second group of pads including a plurality of second pads provided apart from the first pads and arranged in a first direction parallel to the third surface as viewed from above a top surface of the first surface, and connected to the first pads in the circuit board, a ground layer provided between the first surface and the second surface, and extending in a second direction parallel to the first surface and perpendicular to the first direction, a third pad provided on the first surface on a side apart from the second group of pads in the second direction, and connected to the ground layer, and a fourth pad provided on the first surface, and connected to the ground layer and the external conductor.

The third pad is provided on a side apart from the first group of pads with respect to the second group of pads in the second direction, connected to the ground layer, and provided on the first surface. In addition, connector pins connected to the second group of pads through which signals are transmitted are provided above the third pad. Therefore, even in the case where the frequency of signals transmitted via the connector pins is high, for example, even in the case where the frequency is around 20 GHz, unmatching of the differential impedance can be suppressed in the connecting part of the connector pins and the second group of pads, and signal reflection in the vicinity of this connecting part can be suppressed.

Details of the Embodiment of the Present Disclosure

In the following, embodiments of the present disclosure will be described in detail with reference to the accompanying drawings; however, the present embodiments are not limited as exemplified. Note that in the present specification and drawings, components having substantially the same functional configurations may be assigned the same reference numerals, to omit duplicated description.

[Configuration of Multi-Conductor Cable]

At the outset, a configuration of a connector attached multi-conductor cable according to an embodiment will be described. FIG. 1 is a perspective view illustrating a configuration of a connector attached multi-conductor cable according to an embodiment.

The connector attached multi-conductor cable 1 according to the present embodiment can be used, for example, as a cable connecting electronic devices with each other (not illustrated). Note that each of U, D, F, B, R, and L shown in FIG. 1 and the like designates a direction with respect to the connector attached multi-conductor cable 1, where U designates an upward direction, D designates a downward direction, F designates a forward direction, B designates a backward direction, R designates a rightward direction, and L designates a leftward direction. An RL direction is an example of a first direction, an FB direction is an example of a second direction, and a UD direction is an example of a third direction.

As illustrated in FIG. 1, the connector attached multi-conductor cable 1 includes a multi-conductor cable 2, a first connector 3, and a second connector 4. The first connector 3 is attached to one end of the multi-conductor cable 2 on a side in the forward direction F. The second connector 4 is attached to one end of the multi-conductor cable 2 on a side in the backward direction B.

The connector attached multi-conductor cable 1 includes connector plugs 5 each connected to a receptacle of an electronic device (not illustrated), in the forward direction F with respect to the first connector 3 and in the backward direction B with respect to the second connector 4. A substantially cylindrical metal shell 5a is provided as a housing for the connector plug 5. Inside the metal shell 5a, a pin holding plate 5b is housed. The pin holding plate 5b is a member to hold contact pins 5c to be connected to a receptacle of an electronic device (not illustrated). The contact pins 5c are held in the pin holding plate 5b so as to have an arrangement that is connectable to a receptacle of an electronic device even if the orientations of the leftward direction L and the rightward direction R, and of the upward direction U and the downward direction D of the first connector 3 and the second connector 4 are reversed.

The first connector 3 includes a first circuit board 11 in its inside, to which the multi-conductor cable 2 is connected. The first circuit board 11 includes a first surface 11A, a second surface 11B, and a third surface 11C. In the present example, the first surface 11A is a surface of the first circuit board 11 on a side in the upward direction U; the second surface 11B is a surface of the first circuit board 11 on a side in the downward direction D; and the third surface 11C is a surface of the first circuit board 11 on a side in the forward direction F. The first circuit board 11 includes a first circuit 12, a group of pads 40f connected to one end of the first circuit 12 on a side in the backward direction B, and a group of connector pads 60f connected to the other end of the first circuit 12 on a side in the forward direction F. The group of pads 40f and the group of connector pads 60f are provided on the first surface 11A and the second surface 11B of the first circuit board 11. For example, the first circuit board 11 has a thickness of between 0.5 mm and 1.0 mm. The first circuit board 11 is formed to have a substantially flat shape.

The second connector 4 includes a second circuit board 13 in its inside, to which the multi-conductor cable 2 is connected. The second circuit board 13 includes a first surface 13A, a second surface 13B, and a third surface 13C. In the present example, the first surface 13A is a surface of the second circuit board 13 on a side in the upward direction U; the second surface 13B is a surface of the second circuit board 13 on a side in the downward direction D; and the third surface 13C is a surface of the second circuit board 13 on a side in the backward direction B. The second circuit board 13 includes a second circuit 14, a group of pads 40b connected to one end of the second circuit 14 on a side in the forward direction F, and a group of connector pads 60b connected to the other end of the second circuit 14 on a side in the backward direction B. The group of pads 40b and the group of connector pads 60b are provided on the first surface 13A and the second surface 13B of the second circuit board 13. For example, the second circuit board 13 has a thickness of between 0.5 mm and 1.0 mm. The second circuit board 13 is formed to have a substantially flat shape.

The multi-conductor cable 2 includes multiple high-speed signal lines, for example, four pairs of coaxial electric wires, and multiple, for example, seven electric wires. For example, each pair of coaxial electric wires is constituted with two lines as the pair, to transmit a high-speed differential signal. The coaxial electric wires constituting a pair of coaxial electric wires include a central conductor, an insulating layer, an external conductor, and an external cover, in this order from the center toward the outside. The electric wire is constituted with an insulated electric wire having a central conductor and an external cover. The external conductor is an example of a ground conductor, and includes a shielding electric wire or a shielding layer. The coaxial electric wire facilitates high-speed signal transmission.

Figure 2:
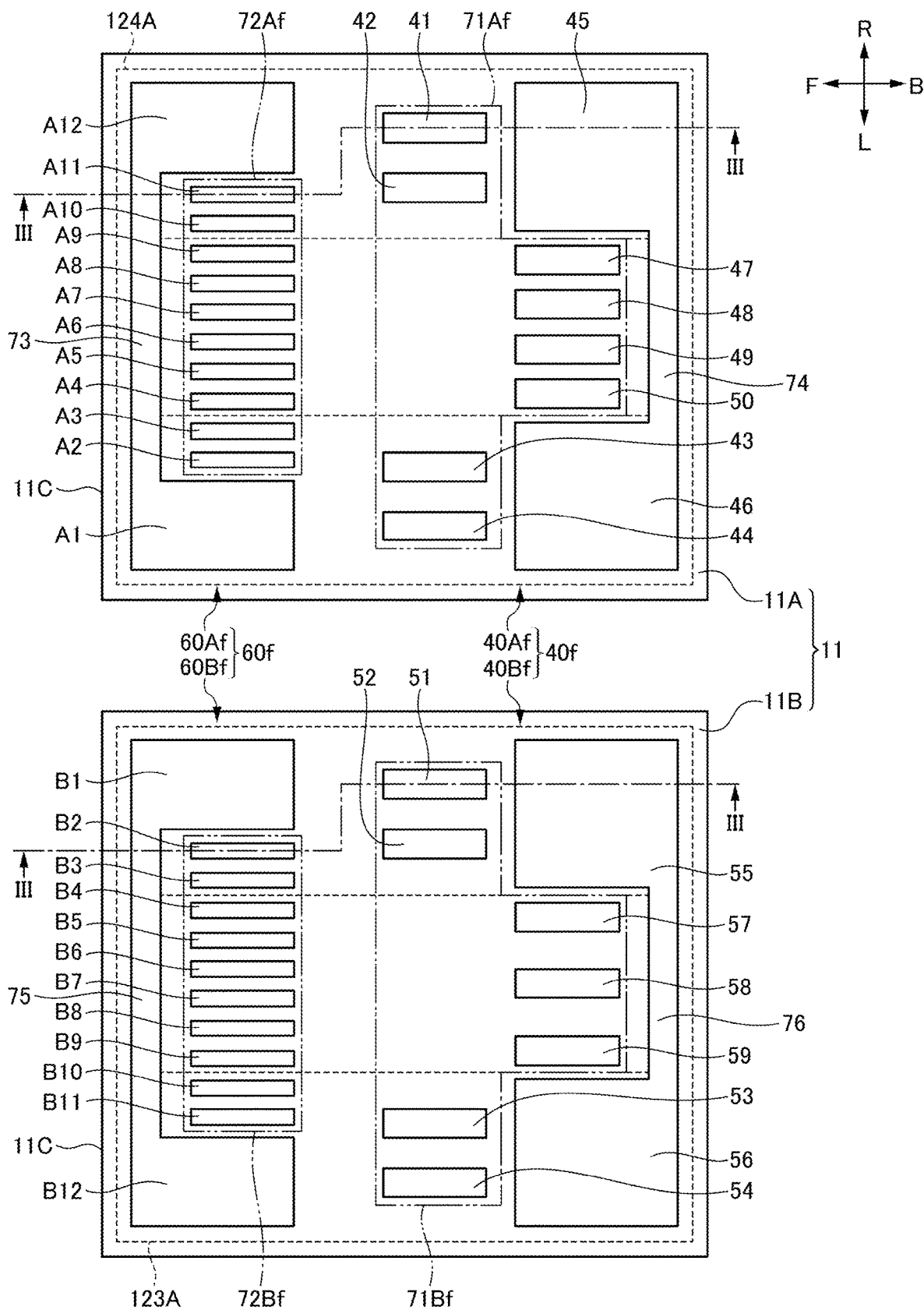
FIG. 2 is a diagram illustrating an example of pads and connector pads provided on a first circuit board.

Next, pads included in the group of pads 40f and connector pads included in the group of pads 60f will be described. FIG. 2 is a diagram illustrating an example of pads and connector pads provided on the first circuit board 11. In FIG. 2, the top surface (the first surface 11A) of the first circuit board 11 is illustrated as viewed from a side in the upward direction U with respect to the connector attached multi-conductor cable 1. The pads and the connector pads provided on the bottom surface (the second surface 11B) of the first circuit board 11 are illustrated to be transparent through the first circuit board 11.

The group of pads 40f includes a first surface-side group of pads 40Af provided on the first surface 11A, and a second surface-side group of pads 40Bf provided on the second surface 11B. The first surface-side group of pads 40Af includes pads 41, 42, 43, 44, 45, 46, 47, 48, 49, and 50. The second surface-side group of pads 40Bf includes pads 51, 52, 53, 54, 55, 56, 57, 58, and 59.

As illustrated in FIG. 2, on the first surface 11A, the pad 46 is provided in the leftward direction L with respect to the pad 45; and the pads 47, 48, 49, and 50 are provided between the pad 45 and the pad 46, in this order from the rightward direction R toward the leftward direction L. On the first surface 11A, the pads 41 and 42 are provided in the forward direction F with respect to the pad 45, and the pads 43 and 44 are provided in the forward direction F with respect to the pad 46. On the first surface 11A, a connecting pad 74 connected to the pads 45 and 46 is provided in the backward direction B with respect to the pads 47 to 50. The connecting pads 74 may be included in the first surface-side group of pads 40Af.

As illustrated in FIG. 2, on the second surface 11B, the pad 56 is provided in the leftward direction L with respect to the pad 55; and the pads 57, 58, and 59 are provided between the pad 55 and the pad 56, in this order from the rightward direction R toward the leftward direction L. On the second surface 11B, the pads 51 and 52 are provided in the forward direction F with respect to the pad 55, and the pads 53 and 54 are provided in the forward direction F with respect to the pad 56. On the second surface 11B, a connecting pad 76 connected to the pads 55 and 56 is provided in the backward direction B with respect to the pads 57 to 59. The connecting pads 76 may be included in the second surface-side group of pads 40Bf.

The first surface-side group of pads 40Af and the second surface-side group of pads 40Bf are connected to the end of the multi-conductor cable 2 on a side in the forward direction F.

The respective central conductors of one pair of coaxial electric wires among the four pairs of coaxial electric wires included in the multi-conductor cable 2 are connected to the pads 41 and 42 of the first surface 11A. The respective external conductors of the pair of coaxial electric wires are connected to the pad 45. The respective central conductors of another pair of coaxial electric wires are connected to the pads 43 and 44 of the first surface 11A. The respective external conductors of the pair of coaxial electric wires are connected to the pad 46. The respective central conductors of another pair of coaxial electric wires are connected to the pads 51 and 52 of the second surface 11B. The respective external conductors of the pair of coaxial electric wires are connected to the pad 55. The respective central conductors of another pair of coaxial electric wires are connected to the pads 53 and 54 of the second surface 11B. The respective external conductors of the pair of coaxial electric wires are connected to the pad 56.

One of the seven electric wires included in the multi-conductor cable 2 is connected to the pad 47 on the first surface 11A. Another electric wire is connected to the pad 48 on the first surface 11A. Another electric wire is connected to the pad 49 on the first surface 11A. Another electric wire is connected to the pad 50 on the first surface 11A. Another electric wire is connected to the pad 57 on the second surface 11B. Another electric wire is connected to the pad 58 on the second surface 11B. Another electric wire is connected to the pad 59 on the second surface 11B.

The pads 41 to 44 and 47 to 50 are examples of first pads, and the pads 41 to 44 and the pads 47 to 50 are included in a first group of pads 71Af. The pads 45 and 46 constitute an example of a fourth pad. The pads 51 to 54 and 57 to 59 are examples of first pads, and the pads 51 to 54 and the pads 57 to 59 are included in a first group of pads 71Bf. The pads 55 and 56 constitute an example of a fourth pad.

The group of connector pads 60f includes a first surface-side group of connector pads 60Af provided on the first surface 11A, and a second surface-side group of connector pads 60Bf provided on the second surface 11B. The first surface-side group of connector pads 60Af includes connector pads A1, A2, A3, A4, A5, A6, A7, A8, A9, A10, A11, and A12. The connector pads A1 to A12 of the first surface-side connector pads group 60Af are arranged in a row in this order from the leftward direction L toward the rightward direction R on the first surface 11A. In other words, the connector pads A1 to A12 are arranged in the RL direction parallel to the third surface 11C as viewed from above the top surface of the first surface 11A. The second surface-side group of connector pads 60Bf includes connector pads B1, B2, B3, B4, B5, B6, B7, B8, B9, B10, B11, and B12. The connector pads B1 to B12 of the second surface-side connector pads group 60Bf are arranged in a row in this order from the rightward direction R toward the leftward direction L on the second surface 11B. In other words, the connector pads B1 to B12 are arranged in the RL direction parallel to the third surface 11C as viewed from above the top surface of the second surface 11B. On the first surface 11A, a connecting pad 73 connected to the connector pads A1 and A12 is provided in the forward direction F with respect to the connector pads A2 to A11. On the second surface 11B, a connecting pad 75 connected to the connector pads B1 and B12 is provided in the forward direction F with respect to the connector pads B2 to B11. The connecting pads 73 may be included in the first surface-side group of connector pads 60Af. The connecting pads 75 may be included in the second surface-side group of connector pads 60Bf.

The connector pads A1 and A12 are ground terminals (GND) for grounding. The connector pads A2 and A3 are terminals (TX1+, TX1−) for high-speed signal transmission. The connector pads A4 and A9 are terminals (VBUS) for feeding power to a bus. The connector pad A5 is a configuration channel (CC) terminal. The connector pads A6 and A7 are terminals (D+, D−) for data signals. The connector pad A8 is a terminal (SBU1) for a side band. The connector pads A10 and A11 are terminals (RX2+, RX2−) for receiving high-speed signals.

The connector pads B1 and B12 are ground terminals (GND) for grounding. The connector pads B2 and B3 are terminals (TX2+, TX2−) for high-speed signal transmission. The connector pads B4 and B9 are terminals (VBUS) for feeding power to a bus. The connector pad B5 is a terminal (VCONN) for power supply connection. The connector pad B8 is a terminal (SBU2) for a side band. The connector pads B10 and B11 are terminals (RX1+, RX1−) for receiving high-speed signals.

The connector pads A2 to A11 are examples of second pads, and the connector pads A2 to A11 are included in the second group of pads 72Af. The connecting pad 73 is an example of a third pad, and the connector pads A1 and A12 are portions of the third pad. The connector pads B2 to B11 are examples of second pads, and the connector pads B2 to B11 are included in the second group of pads 72Bf. The connecting pad 75 is an example of a third pad, and the connector pads B1 and B12 are portions of the third pad.

The first surface-side group of pads 40Af and the second surface-side group of pads 40Bf are connected by the first circuit 12 to the first surface-side group of connector pads 60Af and the second surface-side group of connector pads 60Bf of the first circuit board 11.

Figure 3:
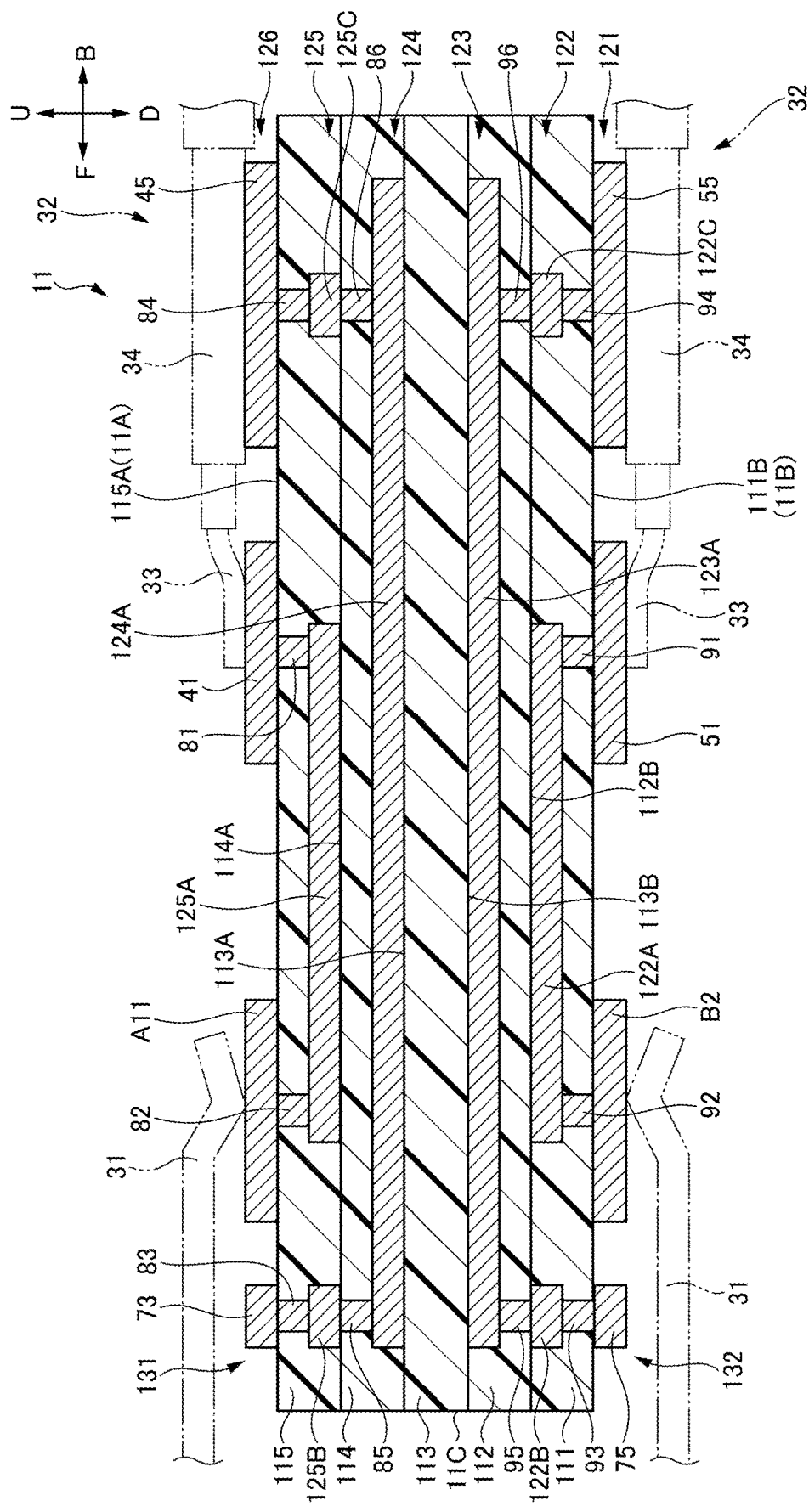
FIG. 3 is a cross sectional view illustrating an example of a cross sectional structure of the first circuit board.

Here, an example of a cross sectional structure of the first circuit board 11 will be described. FIG. 3 is a cross sectional view illustrating an example of a cross sectional structure of the first circuit board 11. FIG. 3 corresponds to a cross sectional view along a line in FIG. 2.

As illustrated in FIG. 3, the first circuit board 11 includes five laminated insulating layers 111, 112, 113, 114, and 115. The insulating layer 112 is provided in the upward direction U with respect to the insulating layer 111; the insulating layer 113 is provided in the upward direction U with respect to the insulating layer 112; the insulating layer 114 is provided in the upward direction U with respect to the insulating layer 113; and the insulating layer 115 is provided in the upward direction U with respect to the insulating layer 114. The first circuit board 11 further includes a wiring layer 121 on a bottom surface 111B of the insulating layer 111; a wiring layer 122 on a bottom surface 112B of the insulating layer 112; a wiring layer 123 on a bottom surface 113B of the insulating layer 113; a wiring layer 124 on a top surface 113A of the insulating layer 113; a wiring layer 125 on a top surface 114A of the insulating layer 114; and a wiring layer 126 on a top surface 115A of the insulating layer 115. The top surface 115A of the insulating layer 115 corresponds to the first surface 11A of the first circuit board 11, and the bottom surface 111B of the insulating layer 111 corresponds to the second surface 11B of the first circuit board 11. As the material of the insulating layers 111 to 115, for example, epoxy glass, fluororesin, or the like may be used. Each of the insulating layers 111 to 115 has a thickness of, for example, greater than or equal to 50 μm and less than or equal to 300 μm. As the material of the insulating layers 121 to 126, for example, copper (Cu) or the like may be used. Each of the insulating layers 121 to 126 has a thickness of, for example, greater than or equal to 10 μm and less than or equal to 100 μm.

The wiring layer 126 includes the first surface-side group of pads 40Af and the first surface-side group of connector pads 60Af. The wiring layer 125 includes multiple wirings 125A, a ground layer 125B, and a ground layer 125C. Each of the multiple wirings 125A is connected to one of the pads 41 to 44 and the pads 47 to 50. Each of the multiple wirings 125A is connected to one of the connector pads A2 to A11. The ground layer 125B is provided in the downward direction D with respect to the connector pad A1, in the downward direction D with respect to the connector pad A12, and in the downward direction D with respect to the connecting pad 73. The ground layer 125C is provided in the downward direction D with respect to the pad 45, in the downward direction D with respect to the pad 46, and in the downward direction D with respect to the connecting pad 74. In the insulating layer 115, conductive vias 81 each connecting one of the wirings 125A to one of the pads 41 to 44 and pads 47 to 50, and conductive vias 82 each connecting one of the wiring 125A to one of the connector pads A2 to A11 are provided. In the insulating layer 115, a conductive via 83 connecting the connector pad A1, the connector pad A12, and the connecting pad 73 with the ground layer 125B is provided. In the insulating layer 115, a conductive via 84 connecting the pad 45, the pad 46, and the connecting pad 74 with the ground layer 125C is provided.

The wiring layer 124 includes a ground layer 124A extending in the FB direction. In the insulating layer 114, a conductive via 85 connecting the ground layer 124A and ground layer 125B, and a conductive via 86 connecting the ground layer 124A and the ground layer 125C are provided.

The connector pad A1, the connector pad A12, and the connecting pad 73 may be integrally formed with the conductive via 83; and the pad 45, the pad 46, and the connecting pad 74 may be integrally formed with the conductive via 84. Each of the connector pads A2 to A11 may be integrally formed with one of the conductive vias 82; and each of the pads 41 to 44 and the pads 47 to 50 may be integrally formed with one of the conductive vias 81. The ground layer 125B may be integrally formed with the conductive via 85; and the ground layer 125C may be integrally formed with the conductive via 86.

The wiring layer 124 is an example of a first ground layer; the ground layer 125B is an example of a second ground layer; and the conductive via 85 is an example of a conductive path. The connecting pad 73, the conductive via 83, the ground layer 125B, and the conductive via 85 are included in a conductive member 131.

The wiring layer 121 includes the second surface-side group of pads 40Bf and the second surface-side group of connector pads 60Bf. The wiring layer 122 includes multiple wirings 122A, a ground layer 122B, and a ground layer 122C. Each of the multiple wirings 122A is connected to one of the pads 51 to 54 and the pads 57 to 59. Each of the multiple wirings 122A is connected to one of the connector pads B2 to B11. The ground layer 122B is provided in the upward direction U with respect to the connector pad B1, in the upward direction U with respect to the connector pad B12, and in the upward direction U with respect to the connecting pad 75. The ground layer 122C is provided in the upward direction U with respect to the pad 55, in the upward direction U with respect to the pad 56, and in the upward direction U with respect to the connecting pad 76. In the insulating layer 111, conductive vias 91 each connecting one of the wirings 122A to one of the pads 51 to 54 and pads 57 to 59, and conductive vias 92 each connecting one of the wiring 122A to one of the connector pads B2 to B11 are provided. In the insulating layer 111, a conductive via 93 connecting the connector pad B1, the connector pad B12, and the connecting pad 75 with the ground layer 122B is provided. In the insulating layer 111, a conductive via 94 connecting the pad 55, the pad 56, and the connecting pad 76 with the ground layer 122C is provided.

The wiring layer 123 includes a ground layer 123A extending in the FB direction. In the insulating layer 112, a conductive via 95 connecting the ground layer 123A and ground layer 122B, and a conductive via 96 connecting the ground layer 123A and the ground layer 122C are provided.

The connector pad B1, the connector pad B12, and the connecting pad 75 may be integrally formed with the conductive via 93; and the pad 55, the pad 56, and the connecting pad 76 may be integrally formed with the conductive via 94. Each of the connector pads B2 to B11 may be integrally formed with one of the conductive vias 92; and each of the pads 51 to 54 and the pads 57 to 59 may be integrally formed with one of the conductive vias 91. The ground layer 122B may be integrally formed with the conductive via 95; and the ground layer 122C may be integrally formed with the conductive via 96.

The wiring layer 123 is an example of a first ground layer; the ground layer 122B is an example of a second ground layer; and the conductive via 95 is an example of a conductive path. The connecting pad 75, the conductive via 93, the ground layer 122B, and the conductive via 95 are included in a conductive member 132.

In the example illustrated in FIG. 3, the wiring 125A is connected to the connector pad A11 and the pad 41, and the wiring 122A is connected to the connector pad B2 and the pad 51. In this example, although the wirings connecting the pads to the connector pads are provided only in the wiring layers 122 and 125, the wirings may also pass through the other wiring layers. Also, a pad on the first surface 11A may be connected to a connector pad on the second surface 11B, and a pad on the second surface 11B may be connected to a connector pad on the first surface 11A.

As illustrated in FIG. 3, each of the connector pads A1 to A12 and the connector pads B1 to B12 is connected with one of the connector pins 31 provided in the connector plug 5. The connector pins 31 are arranged so as to extend in the FB direction. Therefore, the connector pins 31 intersect the connecting pad 73 as viewed from a side in the upward direction U, or intersect the connecting pad 75 as viewed from a side in the downward direction D. The pads 41 to 44 and the pads 51 to 54 are connected with central conductors 33 of coaxial electric wires 32 of the multi-conductor cable 2. The pads 45, 46, 55, and 56 are connected with external conductors 34 of the coaxial electric wires 32. In other words, the pads 41 to 44 and 51 to 54 are pads for signal transmission, and the pads 45, 46, 55, and 56 are pads for grounding. Each of the pads 41 to 44 and 51 to 54 is connected to one of the connector pads A2, A3, A10, A11, B2, B3, B10, and B11 that are terminals for high-speed signal transmission (TX1+, TX1−, TX2+, TX2−) or terminals for high-speed signal reception (RX1+, RX1−, RX2+, RX2−). For example, the pad 41 is connected to the connector pad A11; the pad 42 is connected to the connector pad A10; the pad 43 is connected to the connector pad A3; and the pad 44 is connected to the connector pad A2. For example, the pad 51 is connected to the connector pad B2; the pad 52 is connected to the connector pad B3; the pad 53 is connected to the connector pad B10; and the pad 54 is connected to the connector pad B11.

Figure 4:
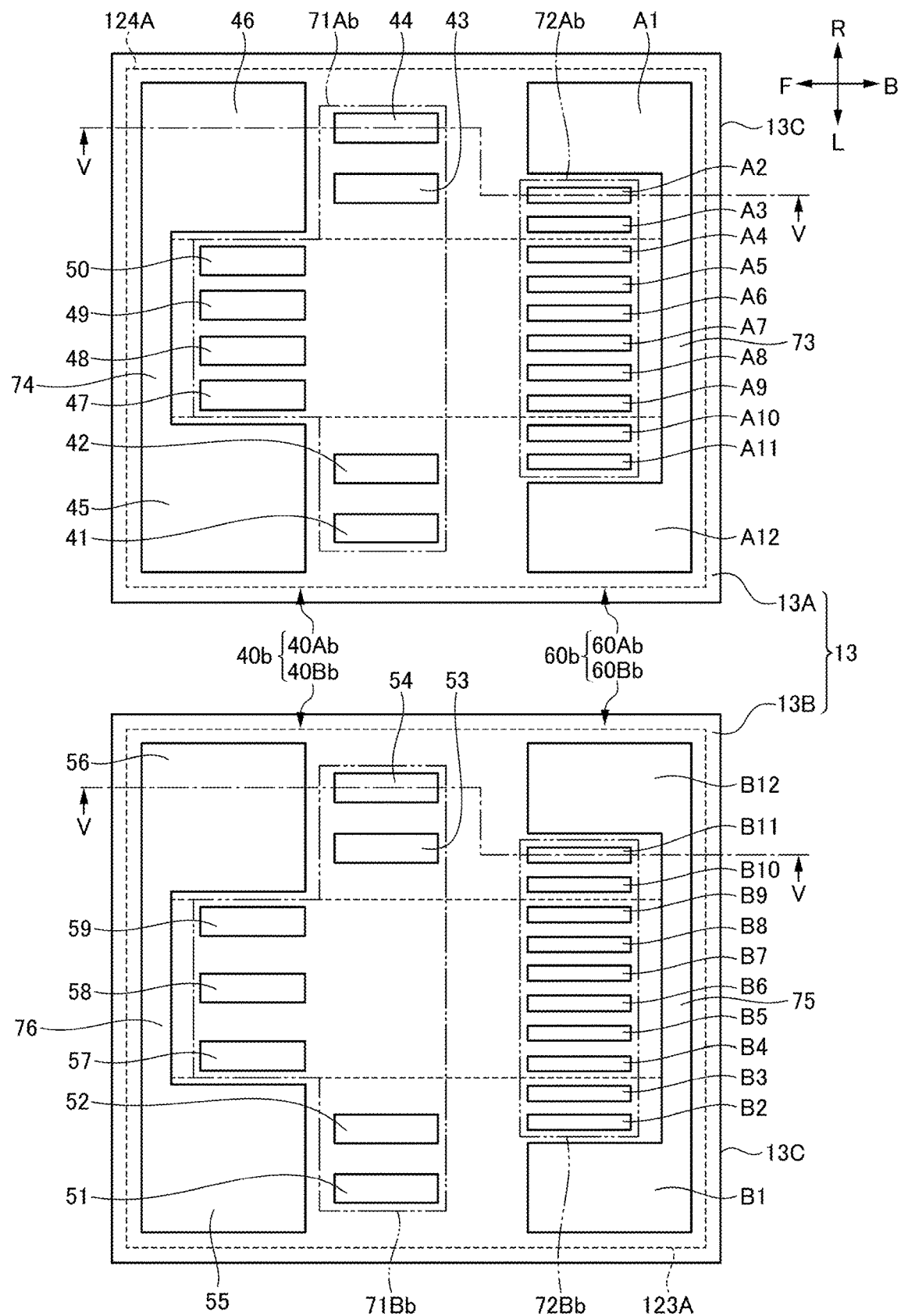
FIG. 4 is a diagram illustrating an example of pads and connector pads provided on a second circuit board.

Next, pads included in the group of pads 40b and connector pads included in the group of pads 60b will be described. FIG. 4 is a diagram illustrating an example of pads and connector pads provided on a second circuit board 13. In FIG. 4, the top surface (the first surface 13A) of the second circuit board 13 is illustrated as viewed from a side in the upward direction U with respect to the connector attached multi-conductor cable 1. The pads and the connector pads provided on the bottom surface (the second surface 13B) of the second circuit board 13 are illustrated to be transparent through the second circuit board 13.

The group of pads 40b includes a first surface-side group of pads 40Ab provided on the first surface 13A, and a second surface-side group of pads 40Bb provided on the second surface 13B. The first surface-side group of pads 40Ab includes the pads 41 to 50, like the first surface-side group of pads 40Af. The second surface-side group of pads 40Bb includes the pads 51 to 59, like the second surface-side group of pads 40Bf.

As illustrated in FIG. 4, on the first surface 13A, the pad 46 is provided in the rightward direction R with respect to the pad 45; and the pads 47, 48, 49, and 50 are provided between the pad 45 and the pad 46, in this order from the leftward direction L toward the rightward direction R. On the first surface 13A, the pads 41 and 42 are provided in the backward direction B with respect to the pad 45, and the pads 43 and 44 are provided in the backward direction B with respect to the pad 46. On the first surface 13A, a connecting pad 74 connected to the pads 45 and 46 is provided in the forward direction F with respect to the pads 47 to 50. The connecting pads 74 may be included in the first surface-side group of pads 40Ab.

As illustrated in FIG. 4, on the second surface 13B, the pad 56 is provided in the rightward direction R with respect to the pad 55; and the pads 57, 58, and 59 are provided between the pad 55 and the pad 56, in this order from the leftward direction L toward the rightward direction R. On the second surface 13B, the pads 51 and 52 are provided in the backward direction B with respect to the pad 55, and the pads 53 and 54 are provided in the backward direction B with respect to the pad 56. On the second surface 13B, a connecting pad 76 connected to the pads 55 and 56 is provided in the forward direction F with respect to the pads 57 to 59. The connecting pads 76 may be included in the second surface-side group of pads 40Bb.

The first surface-side group of pads 40Ab and the second surface-side group of pads 40Bb are connected to the end of the multi-conductor cable 2 on a side in the backward direction B.

The respective central conductors of one pair of coaxial electric wires among the four pairs of coaxial electric wires included in the multi-conductor cable 2 are connected to the pads 41 and 42 of the first surface 13A. The respective external conductors of the pair of coaxial electric wires are connected to the pad 45. The respective central conductors of another pair of coaxial electric wires are connected to the pads 43 and 44 of the first surface 13A. The respective external conductors of the pair of coaxial electric wires are connected to the pad 46. The respective central conductors of another pair of coaxial electric wires are connected to the pads 51 and 52 of the second surface 13B. The respective external conductors of the pair of coaxial electric wires are connected to the pad 55. The respective central conductors of another pair of coaxial electric wires are connected to the pads 53 and 54 of the second surface 13B. The respective external conductors of the pair of coaxial electric wires are connected to the pad 56.

One of the seven electric wires included in the multi-conductor cable 2 is connected to the pad 47 on the first surface 13A. Another electric wire is connected to the pad 48 on the first surface 13A. Another electric wire is connected to the pad 49 on the first surface 13A. Another electric wire is connected to the pad 50 on the first surface 13A. Another electric wire is connected to the pad 57 on the second surface 13B. Another electric wire is connected to the pad 58 on the second surface 13B. Another electric wire is connected to the pad 59 on the second surface 13B.

The pads 41 to 44 and 47 to 50 are examples of first pads, and the pads 41 to 44 and the pads 47 to 50 are included in a first group of pads 71Ab. The pads 45 and 46 constitute an example of a fourth pad. The pads 51 to 54 and 57 to 59 are examples of first pads, and the pads 51 to 54 and the pads 57 to 59 are included in a first group of pads 71Bb. The pads 55 and 56 constitute an example of a fourth pad.

The group of pads 60b includes a first surface-side group of pads 60Ab provided on the first surface 13A, and a second surface-side group of pads 60Bb provided on the second surface 13B. The first surface-side group of connector 60Ab includes the connector pads A1 to A12, like the first surface-side group of connector pads 60Af. The connector pads A1 to A12 of the first surface-side connector pads group 60Ab are arranged in a row in this order from the rightward direction R toward the leftward direction L on the first surface 13A. In other words, the connector pads A1 to A12 are arranged in the RL direction parallel to the third surface 13C as viewed from above the top surface of the first surface 13A. The second surface-side group of connector pads 60Bb includes the connector pads B1 to B12, like the second surface-side group of connector pads 60Bf. The connector pads B1 to B12 of the second surface-side connector pads group 60Bb are arranged in a row in this order from the leftward direction L toward the rightward direction R on the second surface 13B. In other words, the connector pads B1 to B12 are arranged in the RL direction parallel to the third surface 13C as viewed from above the top surface of the second surface 13B. On the first surface 13A, a connecting pad 73 connected to the connector pads A1 and A12 is provided in the backward direction B with respect to the connector pads A2 to A11. On the second surface 13B, a connecting pad 75 connected to the connector pads B1 and B12 is provided in the backward direction B with respect to the connector pads B2 to B11. The connecting pads 73 may be included in the first surface-side group of connector pads 60Ab. The connecting pads 75 may be included in the second surface-side group of connector pads 60Bb.

The connector pads A1 and A12 are ground terminals (GND) for grounding. The connector pads A2 and A3 are terminals (TX1+, TX1−) for high-speed signal transmission. The connector pads A4 and A9 are terminals (VBUS) for feeding power to a bus. The connector pad A5 is a configuration channel (CC) terminal. The connector pads A6 and A7 are terminals (D+, D−) for data signals. The connector pad A8 is a terminal (SBU1) for a side band. The connector pads A10 and A11 are terminals (RX2+, RX2−) for receiving high-speed signals.

The connector pads B1 and B12 are ground terminals (GND) for grounding. The connector pads B2 and B3 are terminals (TX2+, TX2−) for high-speed signal transmission. The connector pads B4 and B9 are terminals (VBUS) for feeding power to a bus. The connector pad B5 is a terminal (VCONN) for power supply connection. The connector pad B8 is a terminal (SBU2) for a side band. The connector pads B10 and B11 are terminals (RX1+, RX1−) for receiving high-speed signals.

The connector pads A2 to A11 are examples of second pads, and the connector pads A2 to A11 are included in the second group of pads 72Ab. The connecting pad 73 is an example of a third pad, and the connector pads A1 and A12 are portions of the third pad. The connector pads B2 to B11 are examples of second pads, and the connector pads B2 to B11 are included in the second group of pads 72Bb. The connecting pad 75 is an example of a third pad, and the connector pads B1 and B12 are portions of the third pad.

The first surface-side group of pads 40Ab and the second surface-side group of pads 40Bb are connected by the second circuit 14 to the first surface-side group of connector pads 60Ab and the second surface-side group of connector pads 60Bb of the second circuit board 13.

Figure 5:
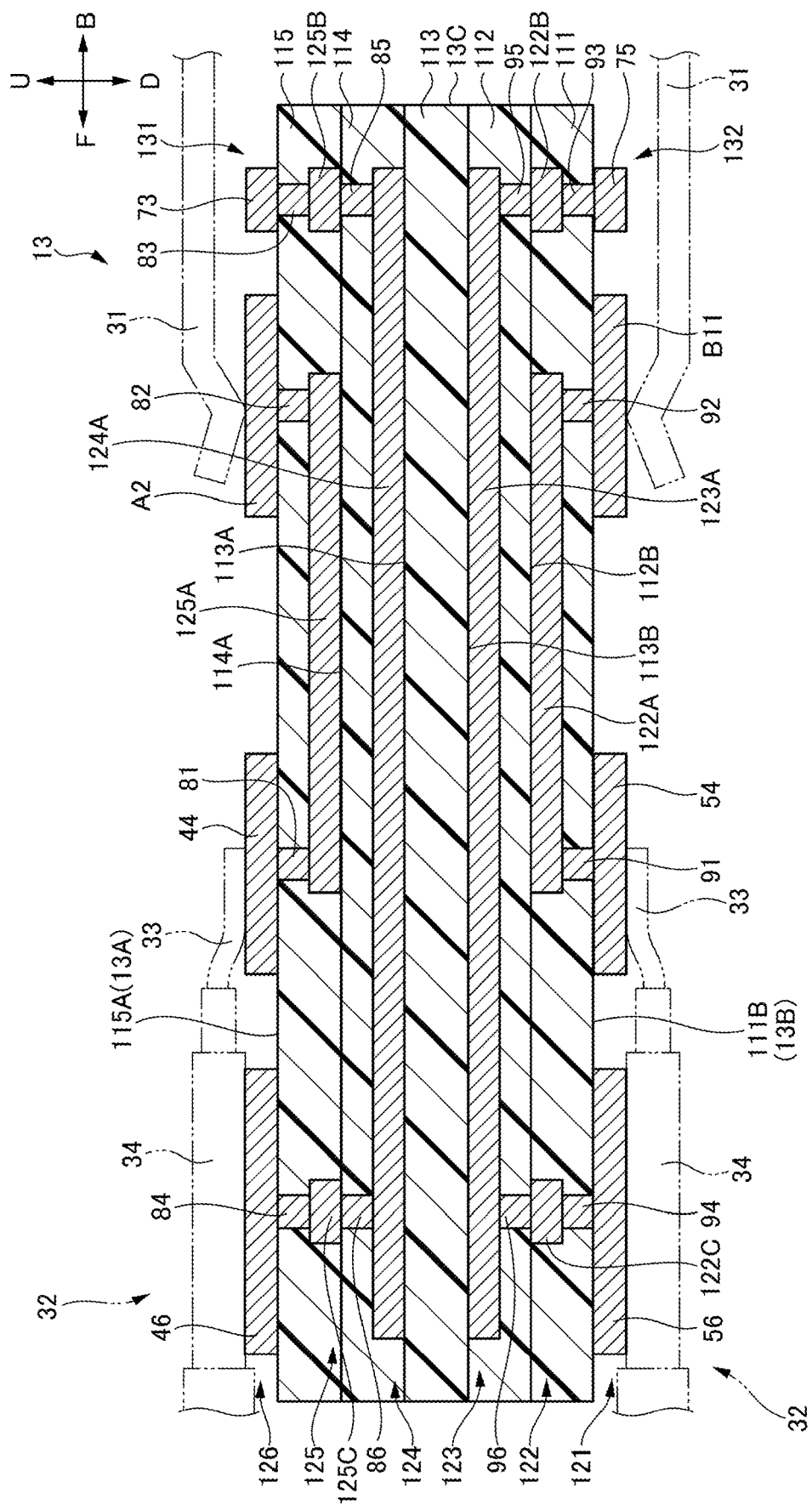
FIG. 5 is a cross sectional view illustrating an example of a cross sectional structure of the second circuit board.

Here, an example of a cross sectional structure of the second circuit board 13 will be described. FIG. 5 is a cross sectional view illustrating an example of a cross sectional structure of the second circuit board 13. FIG. 5 corresponds to a cross sectional view along a line V-V in FIG. 4.

As illustrated in FIG. 5, the second circuit board 13 includes five laminated insulating layers 111 to 115, like the first circuit board 11. The second circuit board 13 further includes wiring layers 121 to 125, like the first circuit board 11. The top surface 115A of the insulating layer 115 corresponds to the first surface 13A of the second circuit board 13, and the bottom surface 111B of the insulating layer 111 corresponds to the second surface 13B of the second circuit board 13.

The wiring layer 126 includes the first surface-side group of pads 40Ab and the first surface-side group of connector pads 60Ab. The wiring layer 125 includes multiple wirings 125A, a ground layer 125B, and a ground layer 125C, like the first circuit board 11. In the insulating layer 115, conductive vias 81 to 84 are provided, like the first circuit board 11. The wiring layer 124 includes a ground layer 124A extending in the FB direction, like the first circuit board 11. In the insulating layer 114, conductive vias 85 to 86 are provided, like the first circuit board 11.

The wiring layer 121 includes the second surface-side group of pads 40Bb and the second surface-side group of connector pads 60Bb. The wiring layer 122 includes multiple wirings 122A, a ground layer 122B, and a ground layer 122C, like the first circuit board 11. In the insulating layer 111, conductive vias 91 to 94 are provided, like the first circuit board 11. The wiring layer 123 includes a ground layer 123A extending in the FB direction, like the first circuit board 11. In the insulating layer 112, conductive vias 95 and 96 are provided, like the first circuit board 11.

In the example illustrated in FIG. 5, the wiring 125A is connected to the connector pad A2 and the pad 44, and the wiring 122A is connected to the connector pad B11 and the pad 54. In this example, although the wirings connecting the pads to the connector pads are provided only in the wiring layers 122 and 125, the wirings may also pass through the other wiring layers. Also, a pad on the first surface 13A may be connected to a connector pad on the second surface 13B, and a pad on the second surface 13B may be connected to a connector pad on the first surface 13A.

As illustrated in FIG. 5, each of the connector pads A1 to A12 and the connector pads B1 to B12 is connected with one of the connector pins 31 provided in the connector plug 5. The connector pins 31 are arranged so as to extend in the FB direction. Therefore, the connector pins 31 intersect the connecting pad 73 as viewed from a side in the upward direction U, or intersect the connecting pad 75 as viewed from a side in the downward direction D. The pads 41 to 44 and the pads 51 to 54 are connected with central conductors 33 of coaxial electric wires 32 of the multi-conductor cable 2. The pads 45, 46, 55, and 56 are connected with external conductors 34 of the coaxial electric wires 32. In other words, the pads 41 to 44 and 51 to 54 are pads for signal transmission, and the pads 45, 46, 55, and 56 are pads for grounding. Each of the pads 41 to 44 and 51 to 54 is connected to one of the connector pads A2, A3, A10, A11, B2, B3, B10, and B11 that are terminals for high-speed signal transmission (TX1+, TX1−, TX2+, TX2−) or terminals for high-speed signal reception (RX1+, RX1−, RX2+, RX2−). For example, the pad 41 is connected to the connector pad A11; the pad 42 is connected to the connector pad A10; the pad 43 is connected to the connector pad A3; and the pad 44 is connected to the connector pad A2. For example, the pad 51 is connected to the connector pad B2; the pad 52 is connected to the connector pad B3; the pad 53 is connected to the connector pad B10; and the pad 54 is connected to the connector pad B11.

In this way, in the first circuit board 11, the conductive member 131 that includes the connecting pad 73, the conductive via 83, the ground layer 125B, and the conductive via 85 is connected to the ground layer 124A. The conductive member 131 is provided in the FB direction on the side apart from the first group of pads 71Af with respect to the second group of pads 72Af. The conductive member 131 is positioned in the UD direction on the first surface 11A side with respect to the ground layer 124A. In addition, the connector pins 31 through which signals are transmitted are provided in the upward direction U with respect to the conductive member 131, and connected to the second group of pads 72Af. Therefore, even in the case where the frequency of signals transmitted via the connector pins 31 is high, for example, even in the case where the frequency is around 20 GHz, unmatching of the differential impedance can be suppressed in the connecting part of the connector pins 31 and the second group of pads 72Af, and signal reflection in the vicinity of this connecting part can be suppressed.

The conductive member 131 includes the conductive vias 85 and the ground layer 125B, and thereby, it becomes easier to position the conductive member 131 on the first surface 11A side with respect to the ground layer 124A. Also, the conductive member 131 includes the connecting pad 73, and thereby, it becomes easier to shorten the distance between the connector pins 31 and the conductive member 131, and to suppress reflection.

The connecting pad 73 is connected to the connector pads A1 and A1t as the ground terminals (GND) for grounding, and the connector pads A1 and A12 function as part of the third pad. Therefore, it becomes easier to hold the electric potential of the connecting pad 73 to the ground.

The connecting pad 73 and the connector pads A2 to A11 are included in the wiring layer 126, and the thickness of the connecting pad 73 is equal to the thickness of the connector pads A2 to A11. Therefore, the connecting pad 73 can be easily formed simultaneously with the connector pads A2 to A11.

It is favorable that the size of the connecting pad 73 in the FB direction is greater than or equal to 0.5 mm and less than or equal to 2.0 mm. If this size is less than 0.5 mm, the effect of suppressing reflection may be reduced. Also, if this size exceeds 2.0 mm, the size of the first circuit board 11 may be excessively large. It is further favorable that the size of the connecting pad 73 in the FB direction is greater than or equal to 0.7 mm and less than or equal to 1.5 mm.

The pads 45 and 46 are provided on the first circuit board 11, and hence, the ground layer 124A can easily be connected with the external conductors 34.

The wirings 125A are provided in the first circuit board 11, and hence, the pads 41 to 44 and the pads 47 to 50 can be easily connected with the connector pads A2 to A11.

Although these effects are related to the configuration on the first surface 11A side of the first circuit board 11, substantially the same effects can be obtained on the second surface 11B side. Also, substantially the same effects can be obtained with the second circuit board 13.

Although the conductive member 131 does not need to be exposed, it is favorable to be exposed on the first surface 11A. Similarly, although the conductive member 132 does not need to be exposed on the second surface 11B, it is favorable to be exposed. This is because it becomes easier to suppress unmatching of the differential impedance.

Figure 6:
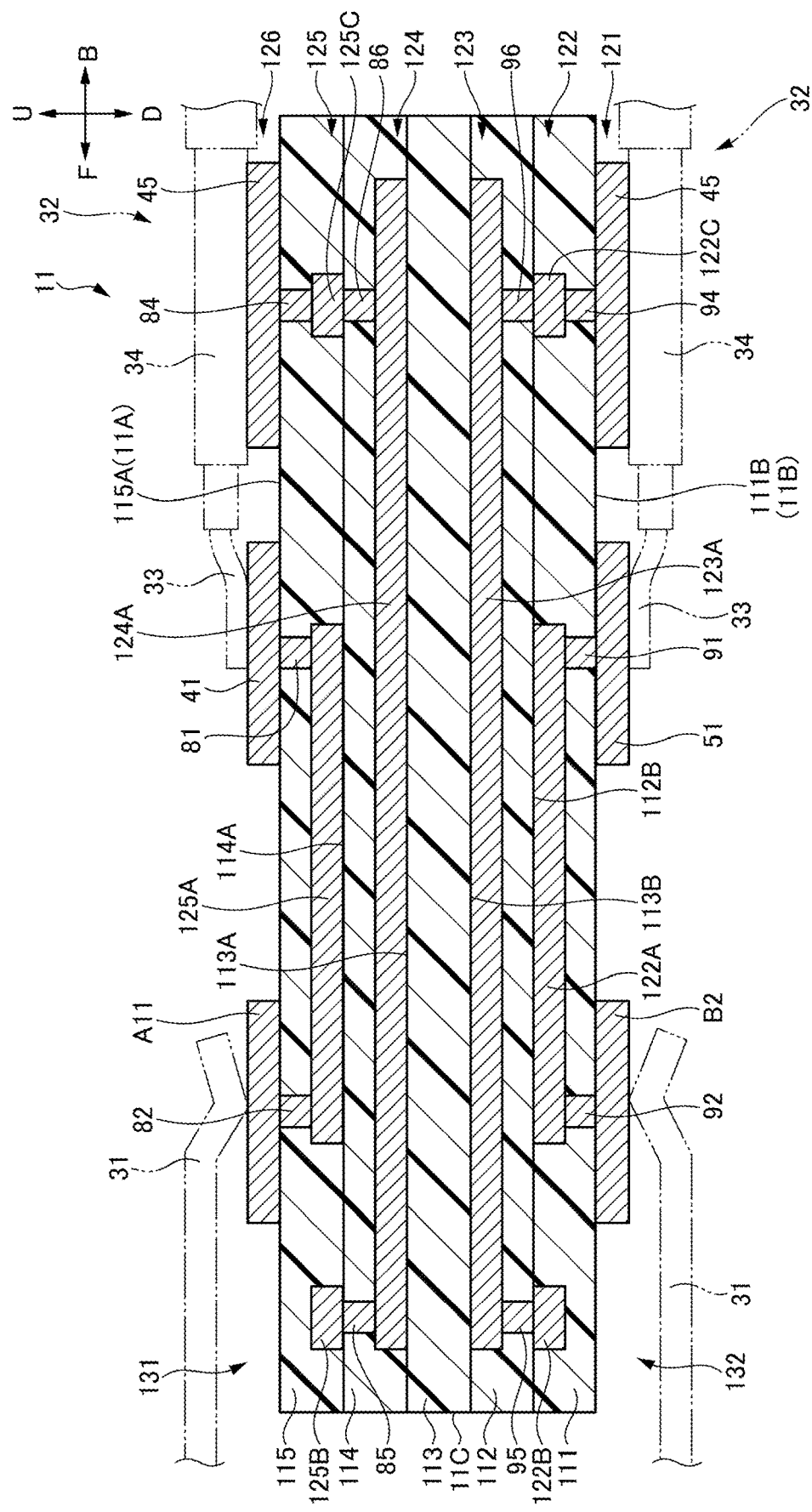
FIG. 6 is a cross sectional view illustrating a modified example of the cross sectional structure of the first circuit board.

Note that if the conductive member 131 is positioned in the UD direction on the first surface 11A with respect to the ground layer 124A, the connecting pad 73 may or may not be provided. Also, if the conductive member 132 is positioned in the UD direction on the second surface 11B with respect to the ground layer 123A, the connecting pad 75 may or may not be provided. FIG. 6 is a cross sectional view illustrating a modified example of the cross sectional structure of the first circuit board 11.

For example, in the first circuit board 11, as illustrated in FIG. 6, the connecting pads 73 and 75 and the conductive vias 83 and 93 may or may not be provided. Even in this case, the conductive member 131 is positioned in the UD direction on the first surface 11A side with respect to the ground layer 124A, and the conductive member 132 is positioned in the UD direction on the second surface 11B side with respect to the ground layer 123A. Therefore, unmatching of the differential impedance can be suppressed, and reflection of signals in the vicinity of this connection part can be suppressed. The same applies to the second circuit board 13.

The number of insulating layers and wiring layers included in the first circuit board 11 and the second circuit board 13 is not limited. For example, each of the first circuit board 11 and the second circuit board 13 may include seven insulating layers and eight wiring layers, or may include three insulating layers and four wiring layers.

As above, the embodiments have been described in detail; note that these are not limited to specific embodiments, and various modifications and changes can be made within the scope described in the claims. For example, these can be applied not only to connector attached multi-conductor cables compliant with specific standards, but also to various types of connector attached multi-conductor cables.

DESCRIPTION OF REFERENCE SYMBOLS

1: connector attached multi-conductor cable
2: multi-conductor cable
3: first connector
4: second connector
5: connector plug
5a: metal shell
5b: pin holding plate
5c: contact pins
11: first circuit board
11A, 13A: first surface
11B, 13B: second surface
11C, 13C: third surface
12: first circuit
13: second circuit board
14: second circuit
31: connector pins
32: coaxial electric wire
33: central conductor
34: external conductor
40f, 40b: group of pads
40Af, 40Ab: first surface-side group of pads
40Bf, 40Bb: second surface-side group of pads
41, 42, 43, 44, 45, 46, 47, 48, 49, 50, 51, 52, 53, 54, 55, 56, 57, 58, 59: pad
60b, 60f: group of connector pads
60Af, 60Ab: first surface-side group of connector pads
60Bf, 60Bb: second surface-side group of connector pads
71Af, 71Ab, 71Bf, 71Bb: first group of pads
72Af, 72Ab, 72Bf, 72Bb: second group of pads
73, 74, 75, 76: connecting pad
81, 82, 83, 84, 85, 86, 91, 92, 93, 94, 95, 96: conductive via
111, 112, 113, 114, 115: insulating layer
111B, 112B, 113B: bottom surface
113A, 114A, 115A: top surface
121, 122, 123, 124, 125, 126: wiring layer
122A, 125A: wiring
122B, 122C, 123A, 124A, 125B, 125C: ground layer
131, 132: conductive member
A1, A2, A3, A4, A5, A6, A7, A8, A9, A10, A11, A12, B1, B2, B3, B4, B5, B6, B7, B8, B9, B10, B11, B12: connector pad

The invention claimed is:

1. A connector attached multi-conductor cable comprising:
a multi-conductor cable including a plurality of electric wires; and
a connector connected to one end of the multi-conductor cable,
wherein the connector includes a circuit board including a first surface, a second surface on a side opposite to the first surface, and a third surface provided at a tip in a direction of connector insertion to connect the first surface to the second surface,
wherein the circuit board includes
a first group of pads including a plurality of first pads provided on the first surface and connected to central conductors of the electric wires,
a second group of pads including a plurality of second pads provided on the first surface, arranged in a first direction parallel to the third surface as viewed from above a top surface of the first surface, and connected to the first pads,
a first ground layer provided between the first surface and the second surface, and extending in a second direction parallel to the first surface and perpendicular to the first direction, and
a conductive member provided on a side apart from the first group of pads in the second direction with respect to the second group of pads, and connected to the first ground layer, and
wherein the conductive member is positioned on the first surface side with respect to the first ground layer in a third direction perpendicular to the first surface.

2. The connector attached multi-conductor cable as claimed in claim 1, wherein the conductive member includes a second ground layer positioned on the first surface side with respect to the first ground layer in the third direction, and
a conductive path connecting the first ground layer and the second ground layer.

3. The connector attached multi-conductor cable as claimed in claim 1, wherein part of the conductive member is exposed on the first surface.

4. The connector attached multi-conductor cable as claimed in claim 1, wherein the conductive member includes a third pad for grounding provided on the first surface on a side apart from the first group of pads in the second direction with respect to the second group of pads.

5. The connector attached multi-conductor cable as claimed in claim 4, wherein the third pad includes a portion arranged in parallel with the plurality of second pads in the first direction.

6. The connector attached multi-conductor cable as claimed in claim 4, wherein a thickness of the third pad is equal to a thickness of the second plurality of pads.

7. The connector attached multi-conductor cable as claimed in claim 4, wherein a size of the third pad in the second direction is greater than or equal to 0.5 mm and less than or equal to 2.0 mm.

8. The connector attached multi-conductor cable as claimed claim 1, wherein the first pads and the second pads are pads for signal transmission.

9. The connector attached multi-conductor cable as claimed in claim 1, wherein the multi-conductor cable includes a ground conductor, and
wherein the circuit board includes a fourth pad provided on the first surface, and connected to the first ground layer and the ground conductor.

10. The connector attached multi-conductor cable as claimed in claim 9, wherein the electric wire is a coaxial electric wire including an insulating layer formed on an outer circumference of the central conductor, and an external conductor formed on an outer circumference of the insulating layer, and
wherein the ground conductor is the external conductor.

11. The connector attached multi-conductor cable as claimed claim 1, wherein the circuit board includes a plurality of wirings each connected to one of the plurality of first pads, and
wherein the one of the plurality of wirings is connected to one of the plurality of second pads.

12. A connector attached multi-conductor cable comprising:
a multi-conductor cable including a plurality of coaxial electric wires; and
a connector connected to one end of the multi-conductor cable,
wherein each of the plurality of coaxial electric wire includes
a central conductor,
an insulating layer formed on an outer periphery of the central conductor, and
an external conductor formed on an outer circumference of the insulating layer,
wherein the connector includes a circuit board including a first surface, a second surface on a side opposite to the first surface, and a third surface provided at a tip in a direction of connector insertion to connect the first surface to the second surface, and
wherein the circuit board includes
a first group of pads including a plurality of first pads provided on the first surface to which the central conductors are connected,
a second group of pads including a plurality of second pads provided apart from the first pads and arranged in a first direction parallel to the third surface as viewed from above a top surface of the first surface, and connected to the first pads in the circuit board,
a ground layer provided between the first surface and the second surface, and extending in a second direction parallel to the first surface and perpendicular to the first direction,
a third pad provided on the first surface on a side apart from the second group of pads in the second direction, and connected to the ground layer, and
a fourth pad provided on the first surface, and connected to the ground layer and the external conductor.

13. The connector attached multi-conductor cable as claimed in claim 1, further comprising:
a wiring electrically connecting a first pad with a second pad,
wherein the wiring is provided between the first ground layer and the first pad in the third direction, and overlaps with the first ground layer as viewed from the first surface.

14. The connector attached multi-conductor cable as claimed in claim 1, wherein an interval between first pads is greater than an interval between second pads.

15. The connector attached multi-conductor cable as claimed in claim 9, wherein the electric wire includes
a coaxial electric wire including an insulating layer formed on an outer circumference of one of the central conductors, and
an insulated electric wire having an external cover formed on an outer circumference of one of the central conductors,
wherein the first group of pads includes one first pad connect to the coaxial electric wire, and another first pad connect to the insulated electric wire, and
wherein the fourth pad includes two pads provided to have said another first pad interposed in-between in the first direction, and a first connecting pad connecting the two pad.

16. The connector attached multi-conductor cable as claimed in claim 15, wherein the conductive member includes a third pad for grounding provided on the first surface on a side apart from the first group of pads in the second direction with respect to the second group of pads,
wherein the third pad includes two connector pads provided to have a second pad interposed in-between in the first direction, and a second connecting pad connecting the two connector pad, and
wherein a length of the first connecting pad is shorter than a length of the second connecting pad in the first direction.

* * * * *